(12) United States Patent
Kawase et al.

(10) Patent No.: US 7,045,951 B2
(45) Date of Patent: May 16, 2006

(54) DISPLAY UNIT

(75) Inventors: Kimitaka Kawase, Kanagawa (JP);
Yasunori Kijima, Tokyo (JP); Yukio Sato, Kanagawa (JP); Hitoshi Tamashiro, Kanagawa (JP)

(73) Assignee: Sony Corporation, Tokyo (JP)

( * ) Notice: Subject to any disclaimer, the term of this patent is extended or adjusted under 35 U.S.C. 154(b) by 223 days.

(21) Appl. No.: 10/655,146

(22) Filed: Sep. 4, 2003

(65) Prior Publication Data

US 2004/0051451 A1   Mar. 18, 2004

(30) Foreign Application Priority Data

Sep. 13, 2002   (JP) ............................ P2002-267847

(51) Int. Cl.
*H05B 33/02* (2006.01)
(52) U.S. Cl. .................. 313/504; 313/506; 313/512
(58) Field of Classification Search ........... 313/504, 313/506, 509–512; 428/690, 917
See application file for complete search history.

(56) References Cited

U.S. PATENT DOCUMENTS

| | | | | |
|---|---|---|---|---|
| 5,838,405 A | * | 11/1998 | Izumi et al. | 349/73 |
| 5,867,236 A | * | 2/1999 | Babuka et al. | 349/73 |
| 6,129,804 A | * | 10/2000 | Gaynes et al. | 156/297 |
| 6,624,570 B1 | * | 9/2003 | Nishio et al. | 313/506 |
| 6,822,389 B1 | * | 11/2004 | Kwasnick et al. | 313/500 |
| 2002/0030443 A1 | * | 3/2002 | Konuma et al. | 313/504 |

FOREIGN PATENT DOCUMENTS

JP   2001100668 A   *   4/2001

* cited by examiner

*Primary Examiner*—Ashok Patel
(74) *Attorney, Agent, or Firm*—Robert J. Depke; Trexler, Bushnell, Giangiorgi, Blackstone & Marr, Ltd.

(57) ABSTRACT

A display unit includes a plurality of panels joined to each other into one display screen. Each of the panels is formed by using organic EL devices. In this display unit, a seal material is applied to a joint portion between adjacent two of the panels in such a manner as to cover the joint portion, to thereby suppress permeation of moisture, air, and the like in the organic EL devices.

1 Claim, 11 Drawing Sheets

F I G. 7 E
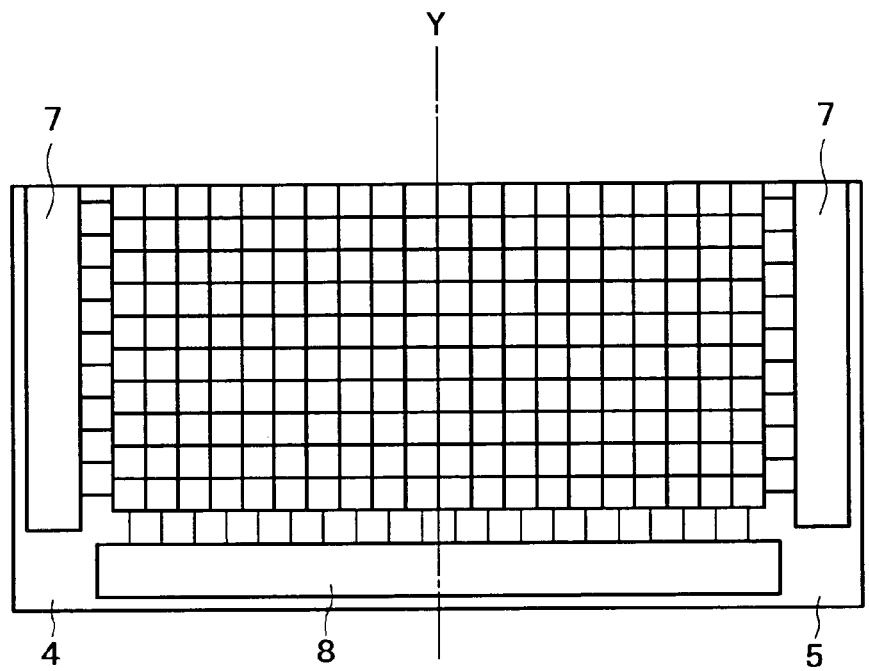
F I G. 8
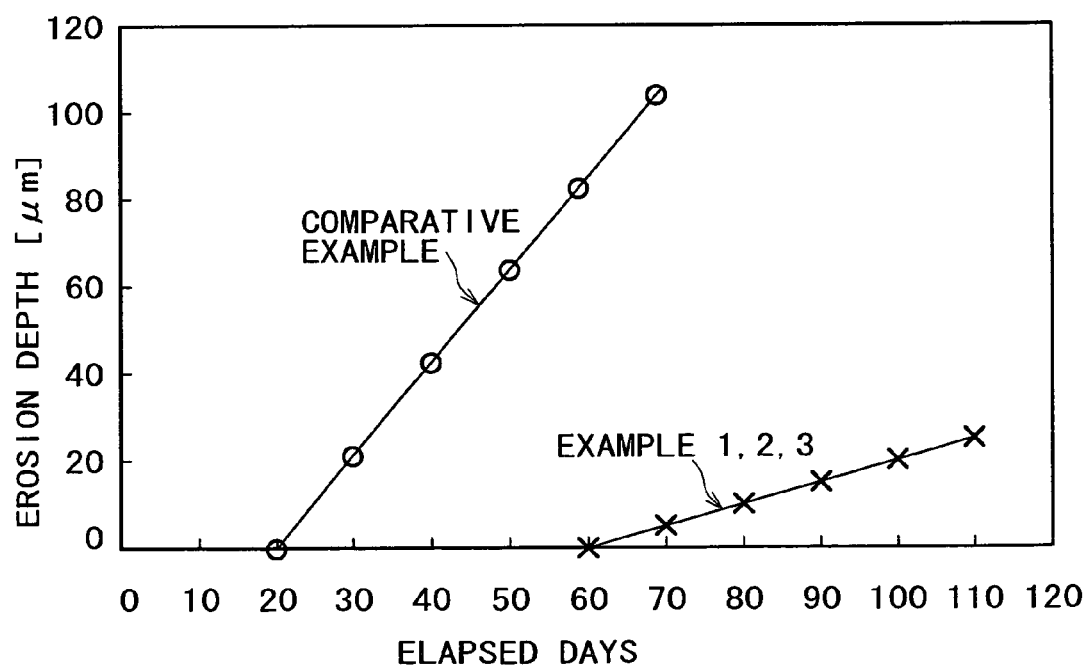

DISPLAY UNIT

BACKGROUND OF THE INVENTION

The present invention relates to a display unit using organic electroluminescence devices (hereinafter, referred to often as "organic EL devices").

Recently, in studies and developments for display units coping with the tendency toward higher speed of information, there have been demands toward enlargement of display units such as televisions and monitors not only for use in public locations (railroad stations, buildings, and antechambers and business rooms of hotels) but also for use in general households.

If the screens of display units are enlarged, however, CRTs (Cathode-Ray Tubes) or monitors such as liquid crystal projectors cause a problem that since the weight and size become large with the increased screen size, the handling becomes inconvenient and the occupied area becomes large.

For this reason, flat display units being thin and lightweight have been required. A display unit using organic EL devices excellent in high efficiency, thinning, lightweightness, and low dependency on viewing angle has become a focus as one of these flat display units, and has been actively studied and developed.

Display units using organic EL devices are now being applied to small-sized display units such as digital cameras and cellular telephones. On the other hand, such display units have been regarded as difficult to be applied to medium/large-sized display units such as monitors for personal computers and televisions and large-sized display units for home theaters. For example, as the size of a substrate of such a display unit using organic EL devices becomes large, the equipment scale becomes large to thereby raise the production cost, and it becomes difficult to uniformly form an organic EL film on the large screen and to obtain uniform brightness over the large screen.

If a panel is of an active matrix type, one or more TFTs (Thin Film Transistors) are provided in pixels for driving the organic EL devices. In this case, as the screen size of the panel becomes larger, the production yield of the TFTs becomes lower due to pixel failures or the like, and thereby it fails to ensure high productivity. Also, if a p-channel transistor is required to be provided in each pixel, or if a CMOS (Complementary Metal Oxide Semiconductor) circuit is formed around a screen for driving the pixel, low-temperature polycrystalline TFTs must be provided. In this case, it is difficult to form the polycrystalline TFTs at once on a large screen by polycrystallization of amorphous silicon by irradiation with laser beams such as excimer laser beams because of the limitation of the width of the laser beams used for polycrystallization. In the case of repeating the laser irradiation by a plurality of times, it is difficult to keep the equalization of TFT characteristics at a joint between laser beams, with a result that portions corresponding to the joints between laser beams form a stripe pattern.

To solve such a problem, in the field of display units using organic EL devices, there has been known a technique of forming one large screen by joining a plurality of small-sized panels to each other on the same plane, as disclosed in Japanese Patent Laid-open Nos. Hei 5-205875, 2001-22293, 2001-100668, 2002-6779, and 2002-108253.

With respect to such a technique, although it is required to make a distance between pixels as small as possible for realizing high-definition of a display screen, it is generally difficult to form patterns of pixel circuits, wiring lines, pixel electrodes in such a manner that the patterns extend to an end face of a substrate of each panel. Accordingly, a large display screen is actually produced by forming patterns of pixel circuits, wiring lines, and pixel electrodes on a raw substrate larger than a finish substrate of a small-sized panel forming part of the large screen, highly accurately cutting the raw substrate at the vicinity of an end face (which is taken as a joint face) by a substrate cutter such as a laser cutter or a dicer, and joining the panels thus obtained to each other.

By the way, in the case of producing one display screen (large screen) by joining a plurality of panels to each other as described above, at a joint portion between adjacent two of the panels, it is required to make a distance between the outermost pixels on both the panels as small as possible in order to make the joint portion inconspicuous. Accordingly, a distance from a cut end face of each panel to an end of the outermost one of pixels on the panel becomes very short. This may cause an inconvenience. In particular, if organic EL devices are formed by low-molecular EL devices, a film of the EL devices, which is formed by a vacuum vapor-deposition process using an opening mask, becomes larger than the opening, to be thereby close to or in contact with the cutting end face. In this case, when panels are joined to each other, the end of the outermost organic EL device is exposed at a joint portion between the adjacent two of the panels. As a result, there occurs a problem associated with erosion of the organic EL devices by permeation of moisture, air, and the like from the exposed portion of the outermost organic EL device.

SUMMARY OF THE INVENTION

An object of the present invention is to provide a display unit including a plurality of panels joined to each other into one display screen, which display unit is intended to effectively suppress erosion of organic EL devices.

To achieve the above object, according to the present invention, there is provided a display unit including a plurality of panels joined to each other into one display screen, each of the panels being formed by using organic electroluminescence devices, wherein a seal material is applied to a joint portion between adjacent two of the plurality of panels in such a manner as to cover the joint portion.

With this configuration, since the seal material is applied to the joint portion between adjacent two of the plurality of panels, it is possible to suppress permeation of moisture, air, and the like to the organic EL devices by the seal material.

BRIEF DESCRIPTION OF THE DRAWINGS

These and other objects, features, and advantages of the present invention will become more apparent from the following detailed description in conjunction with the accompanying drawings, wherein:

FIGS. 7A to 7E are views illustrating steps of producing a panel structure according to Comparative Example;

FIG. 8 is a graph illustrating the result of observing erosion deterioration of organic EL devices;

DETAILED DESCRIPTION OF THE PREFERRED EMBODIMENT

Hereinafter, a preferred embodiment of the present invention will be described in detail with reference to the drawings.

Figure 1:
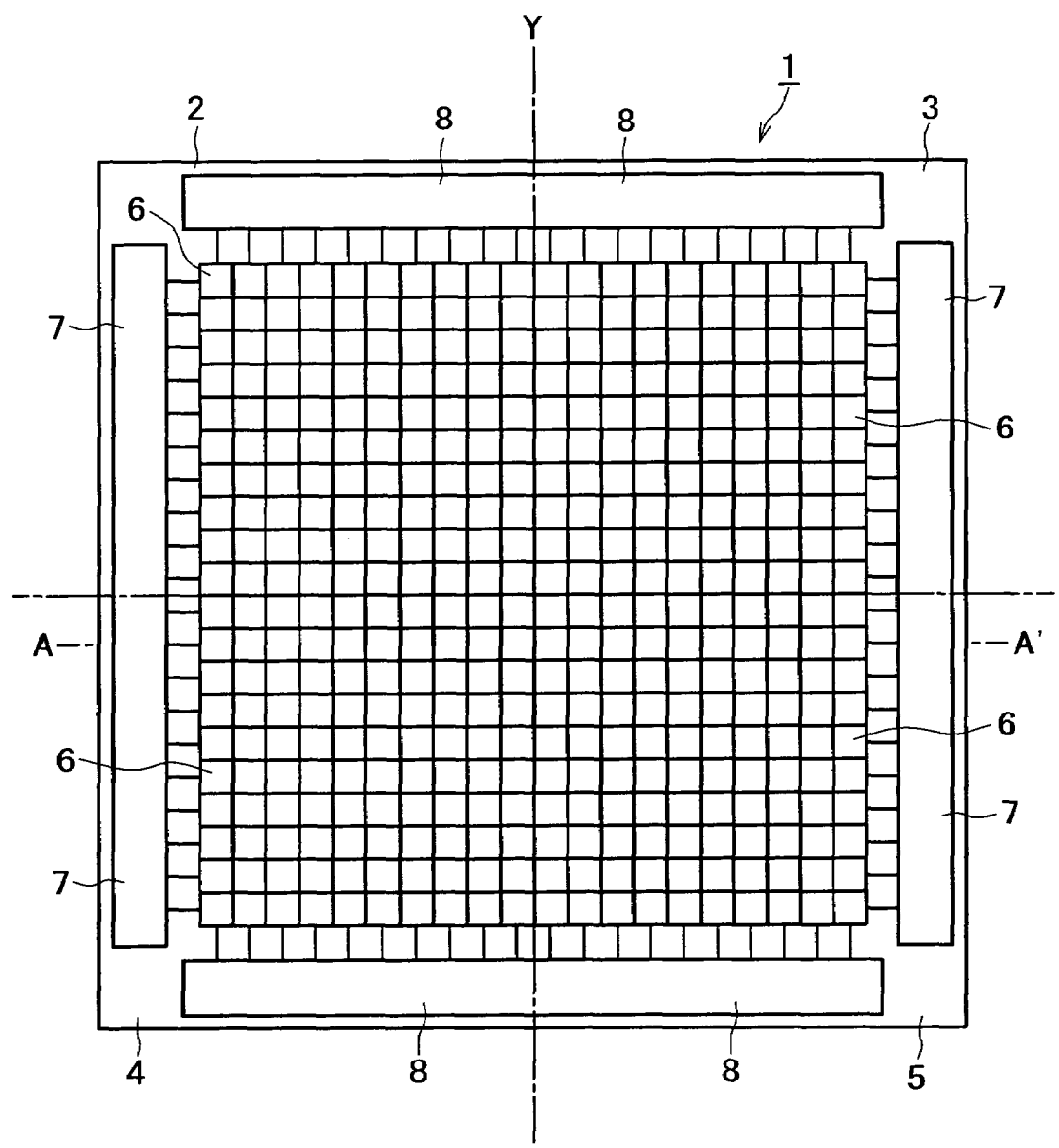
FIG. 1 is a plan view showing a configuration of a display according to an embodiment of the present invention.

FIG. 1 is a plan view showing a configuration of a display unit according to an embodiment of the present invention. The illustrated display unit 1 is of an active matrix type, which includes a plurality (four, in this embodiment) of panels 2, 3, 4 and 5 joined to each other on the same plane into one display screen, wherein each of the panels 2, 3, 4, and 5 is formed by using organic EL devices. Adjacent two of the panels 2, 3, 4 and 5 are joined to each other in such a manner that ends thereof are butted to each other on either of an X-axis and a Y-axis perpendicular to each other at the center of the display unit 1 with a micro-gap kept therebetween. A plurality of pixels 6 are arrayed in a matrix pattern in a display area of the display unit 1. Two vertical scanning drive circuits 7 and two horizontal scanning drive circuits 8 are disposed in such a manner as to surround the display area of the display device 1.

Figure 2:
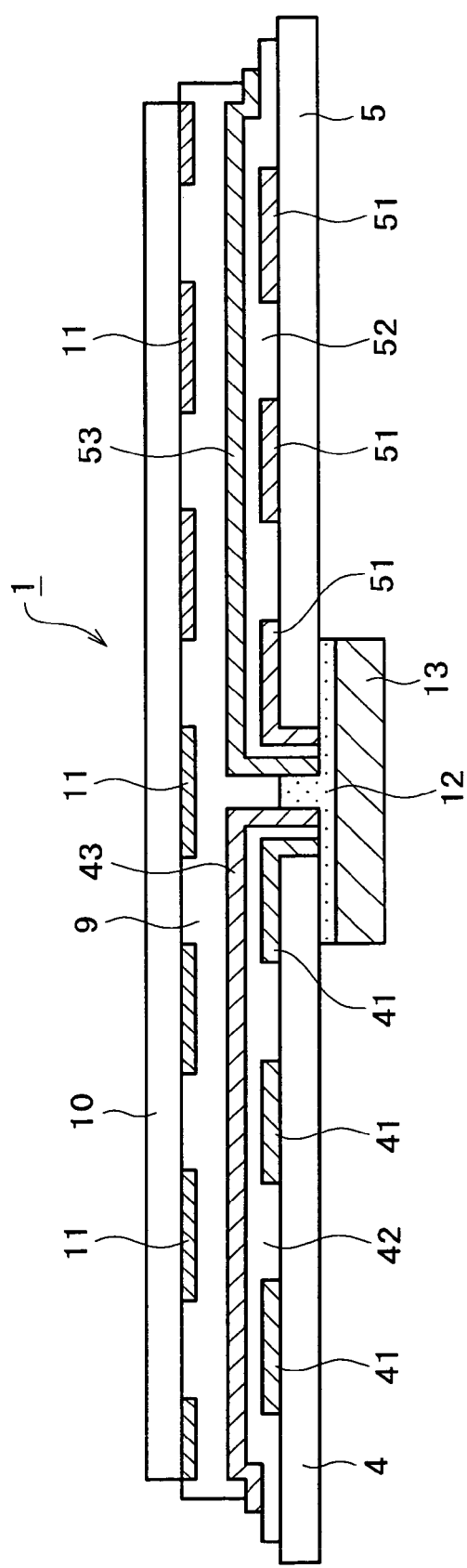
FIG. 2 is a sectional view taken on line A–A' of FIG. 1.
Figure 3:
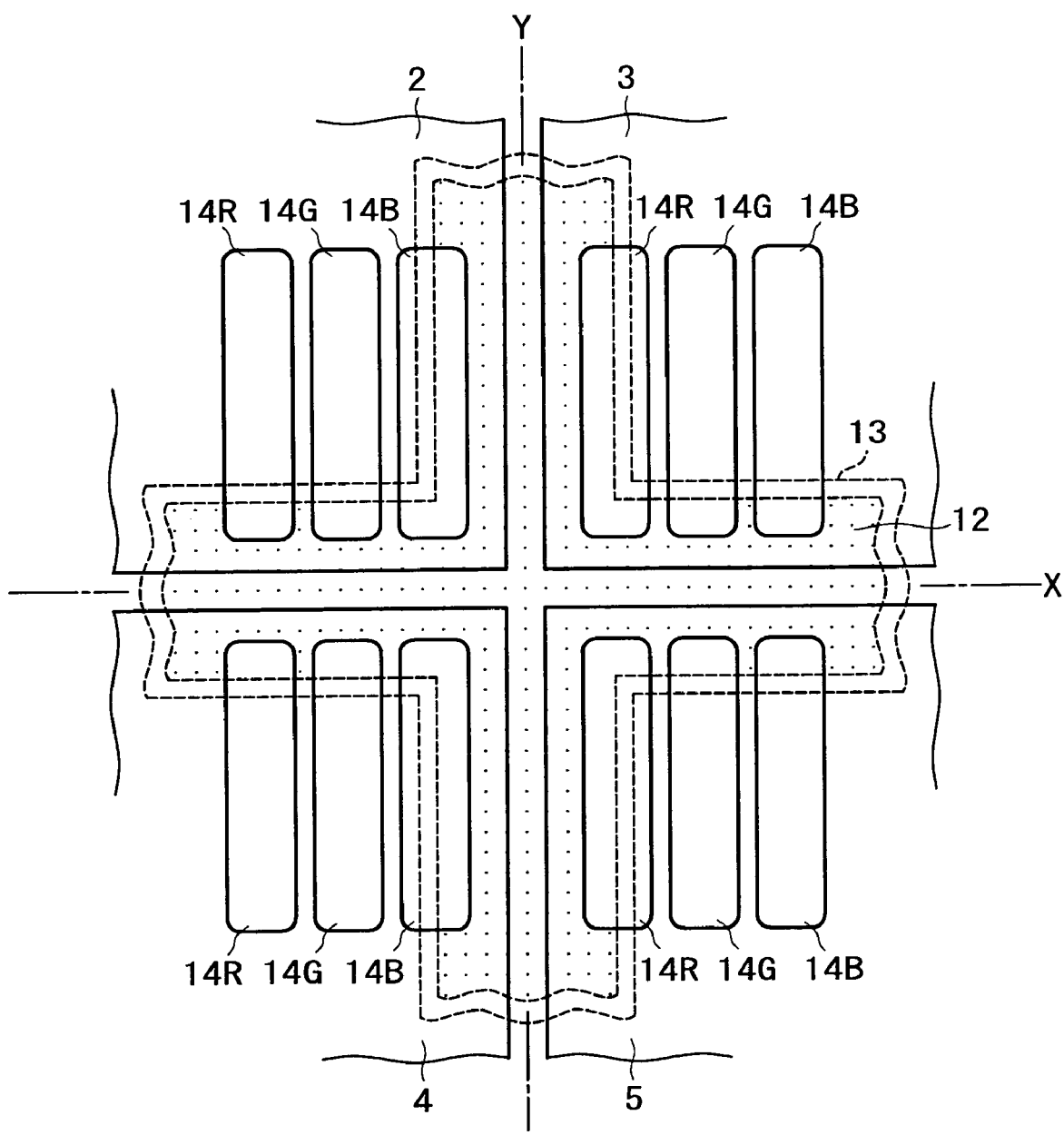
FIG. 3 is an enlarged view of a crossing point between an X-axis and a Y-axis in FIG. 1 and its neighborhood.

FIG. 2 is a sectional view taken on line A–A' of FIG. 1, and FIG. 3 is an enlarged view of an intersection between the X-axis and Y-axis and its neighborhood. As shown in FIG. 2, a plurality of organic EL devices 41 are arrayed in a matrix pattern on one surface of the panel 4. A light translucent cathode electrode layer 42 and a passivation film 43 are sequentially stacked on the organic EL devices 41. Similarly, a plurality of organic EL devices 51 are formed in a matrix pattern on one plane of the panel 5, and a light translucent cathode electrode layer 52 and a passivation film 53 are sequentially stacked on the organic EL devices 51. While not shown, a plurality of organic EL devices and a cathode electrode layer and a passivation film are similarly provided on each of the panels 2 and 3.

The two panels 4 and 5 are adjacently disposed on the same plane, and in this state, a common seal glass member 10 is stuck on the upper surface sides of the panels 4 and 5 via a transparent sealing adhesive material 9. The seal glass member 10 is common to the four panels 2, 3, 4, and 5. The outer size of the seal glass member 10 is set to be nearly equal to the outer size of a panel structure composed of the four panels 2, 3, 4 and 5 joined to each other. Black matrixes 11 are formed on one surface, opposed to the panels 4 and 5, of the seal glass member 10 in such a manner as to each disposed between adjacent two of the organic EL devices 41 and 51. The display unit 1 configured as described above is of a top emission type allowing emergence of light from the upper surface sides, on which the organic EL devices 41 and 51 are provided, of the panels 4 and 5.

A seal material 12 is applied on a joint portion between the panels 4 and 5 in such a manner as to cover the joint portion. The seal material 12 may be a thermosetting resin, a UV-curable resin, or the like. To be more specific, from the back surface side (non-display screen side) of the panel structure composed of the panels 4 and 5, the seal material 12 is applied to bury the joint portion between the panels 4 and 5. It is to be noted that the joint portion is formed as a fine groove when the panels 4 and 5 are joined to each other. As shown in the figure, the seal material 12 is formed into a stripe shape which extends along the joint portion between the panels 4 and 5 and which has a specific width wider than a width of the joint portion (or gap) between the panels 4 and 5. In addition, at the joint portion between the panels 4 and 5, the seal material 12 is applied to cover the end of the outermost organic EL device 41 on the panel 4 side (leftmost organic EL device 41 in FIG. 2) and also cover the end of the outermost organic EL device 51 on the panel 5 side (rightmost organic EL device 51 in FIG. 2).

A plate-like member 13 is stuck on the back surface sides of the panels 4 and 5 in such a manner as to cover the joint portion. The plate-like member 13, which may be made from glass, metal, or the like, is adhesively bonded to the back surfaces of the panels 4 and 5 by making use of the adhesive force of the seal material 12. As shown in FIG. 3, the seal material 12 and the plate-like member 13 are similarly provided for each of the other joint portions, that is, for each of a joint portion between the panels 2 and 3, a joint portion between the panels 2 and 4, and a joint portion between the panels 3 and 4. In addition, as shown in FIG. 3, one set of a sub-pixel portion 14R for emission of light of red, a sub-pixel portion 14G for emission of light of green, and a sub-pixel portion 14B for emission of light of blue, which are adjacent to each other, form one pixel 6 (see FIG. 1).

Figure 4:
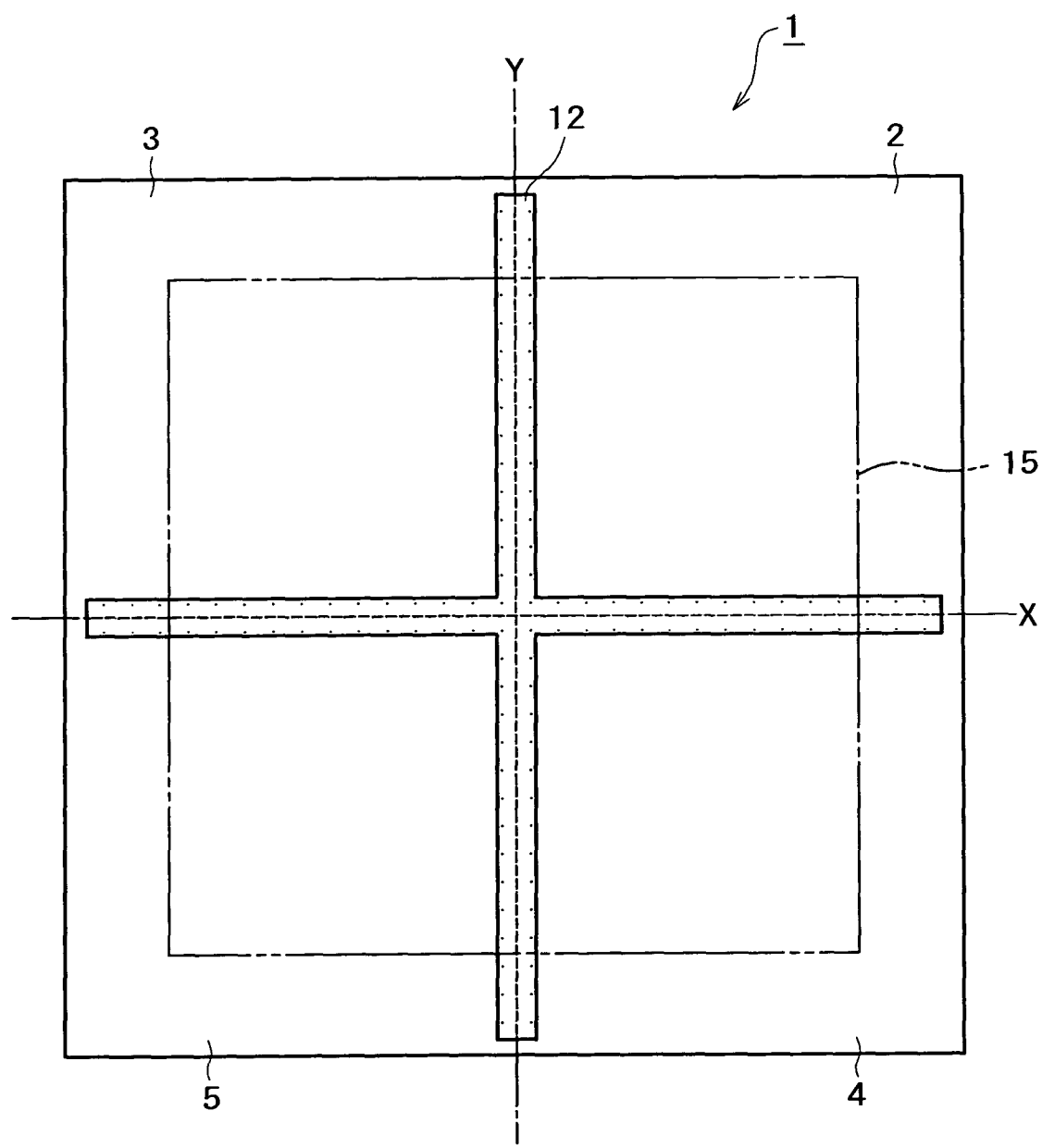
FIG. 4 is a view showing a state that a seal material is applied to all joint portions, at each of which adjacent two of panels are joined to each other.
Figure 5:
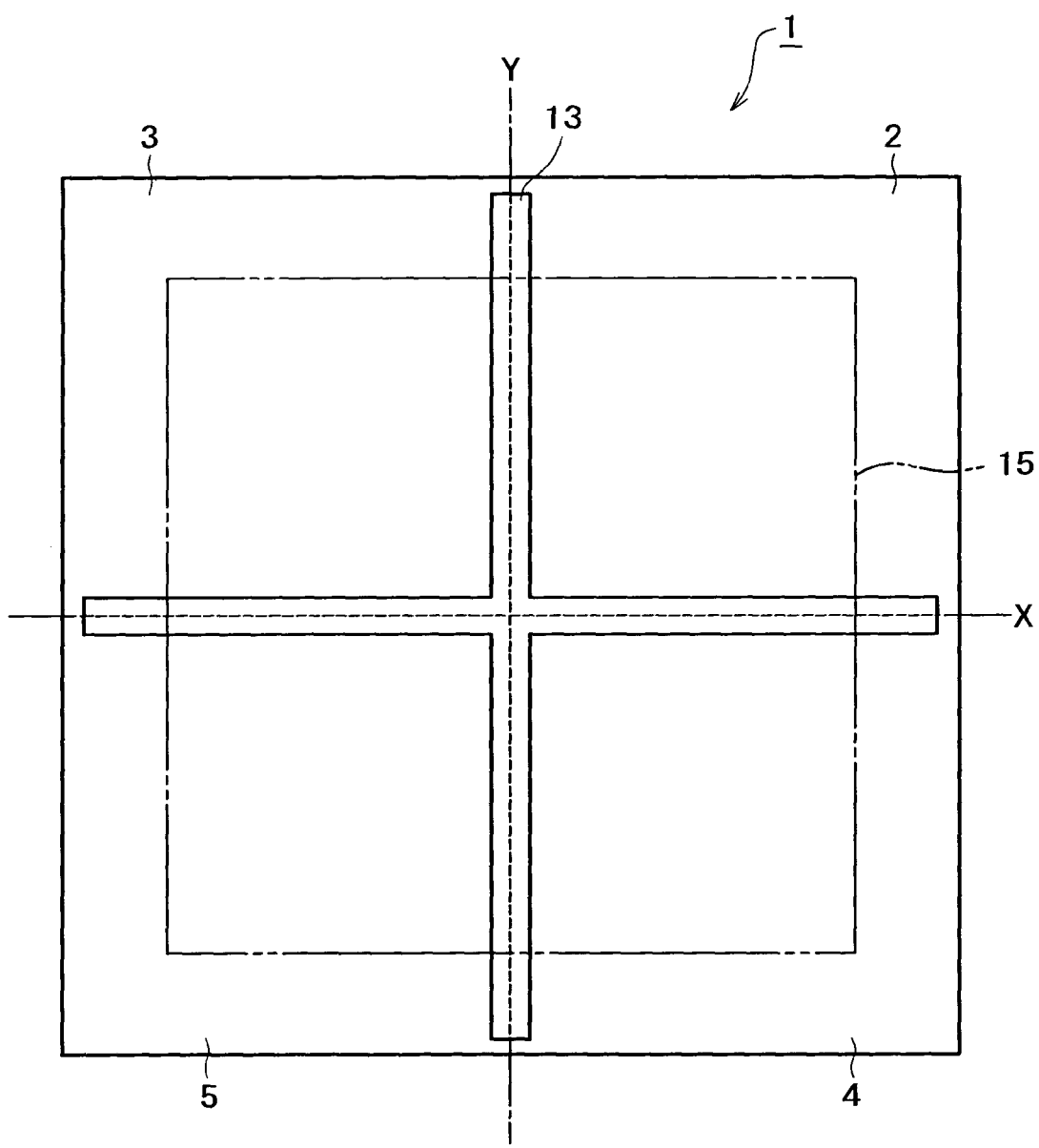
FIG. 5 is a view showing a state that a plate-like member is stuck on the joint portions via the seal material.

On the back surface side of the display unit 1, as shown in FIG. 4), the seal material 12 is formed in a cruciform along the four joint portions each extending between adjacent two of the panels 2, 3, 4, and 5. On the back surface side of the display unit 1, as shown in FIG. 5, the plate-like member 13 having the shape of a cruciform is stuck on the four joint portions in such a manner as to be overlapped to the seal material 12.

After the four panels 2, 3, 4 and 5 are arranged on the same plane, a suitable amount of the sealing adhesive material 9 is applied on the panels 2, 3, 4, and 5, and the seal glass member 10 is stuck thereon. After that, the seal material 12 is applied on the back surface sides (bottom surface sides) of the panels 2, 3, 4, and 5 by using a dispenser or the like. After the seal material 12 is applied, the plate-like member 13 is pressed on the seal material 12.

Since the four panels 2, 3, 4, and 5 are joined to each other into one display screen, a display area for image display can be enlarged. At this time, since the seal material 12 is applied on the joint portion between adjacent two of the panels 2, 3, 4 and 5, it is possible to cover the ends of the outermost organic EL devices 41 and 51 at the joint portion, and hence to suppress permeation of moisture, air, and the like thereto; and since the plate-like member 13 is stuck on the joint portion between adjacent two of the panels 2, 3, 4, and 5, it is possible to reinforce the joint portion and hence to enhance the mechanical strength of the display unit 1.

The plate-like material 13 is preferably made from a material having high thermal conductivity, for example, a metal such as aluminum. With this configuration, it is possible to efficiently release heat caused upon drive of the display unit 1 through the plate-like member 13, and hence to enhance the heat dissipation characteristic of the display unit 1. Further, the surface of the plate-like member 13 is preferably colored into black, for example, by a blackening treatment. With this configuration, it is possible to prevent scattering of light incident from the upper surface side (seal glass member 10 side) of the display unit 1, and hence to make the joint portion between adjacent two of the panels 2, 3, 4 and 5 inconspicuous from external.

Figure 6:
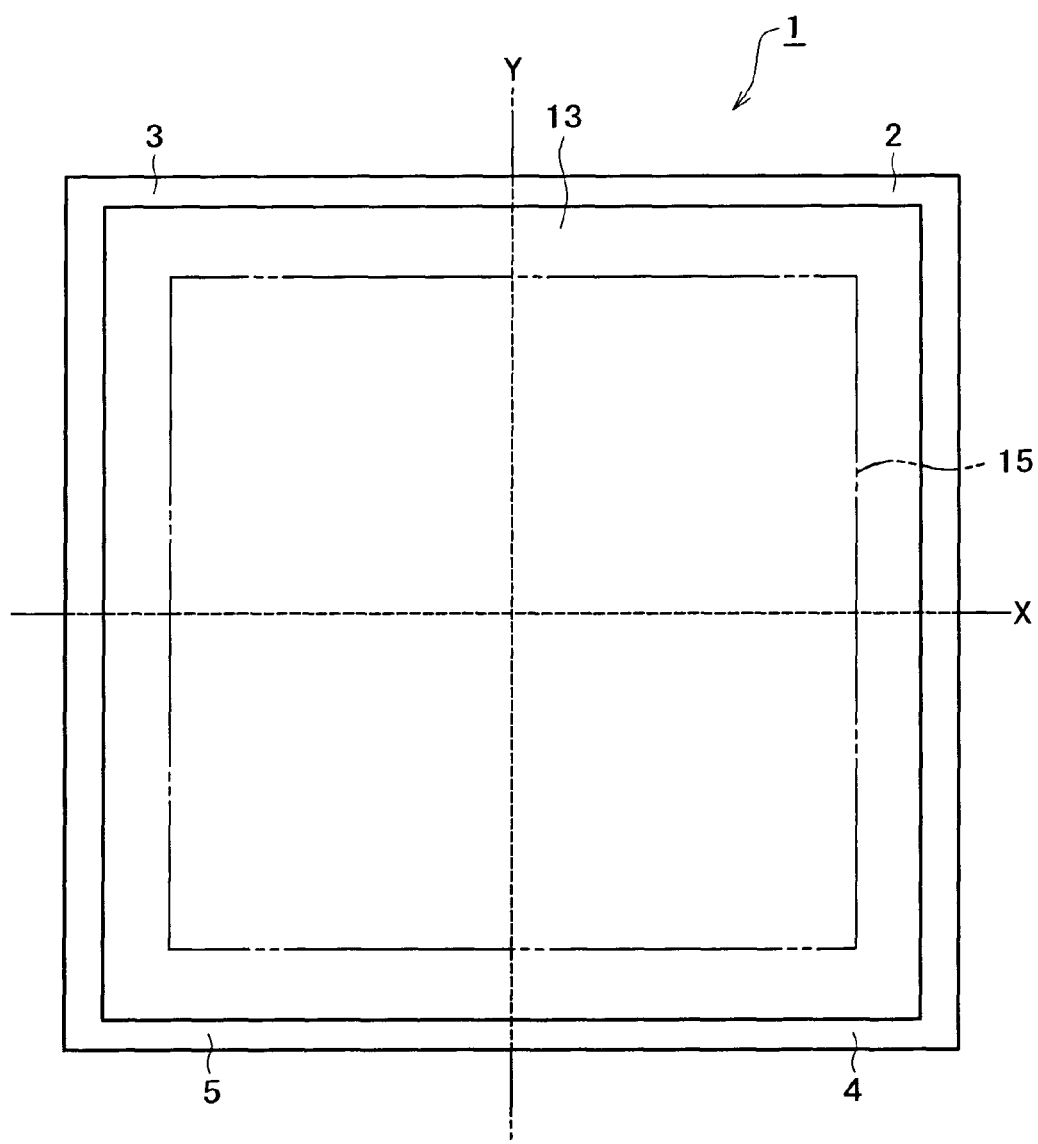
FIG. 6 is a view showing another shape example of the plate-like member.

As shown in FIG. 6, the plate-line member 13 may be formed into a rectangular shape similar to that of the outer shape of the display unit 1. At this time, the outer dimension of the plate-like member 13 is preferably smaller than that of the display unit 1 and larger than that of the display area 15. With this configuration, since the plate-like member 13 is stuck on the entire back surface sides of the panels 2, 3, 4 and 5, it is possible to further enhance both the heat dissipation and the mechanical strength of the display unit 1.

The present invention will be more apparent by way of the following examples. In the examples, parts corresponding to those in the above-described display unit 1 are denoted by the same reference numerals and the overlapped description thereof is omitted.

Comparative Example

In this comparative example, an active matrix type display unit, which includes two panels joined to each other, wherein no seal material is applied to a joint portion between the panels, is prepared, and erosion deterioration of organic EL devices in this display unit is examined. In this display unit, a pixel circuit composed of low-temperature polycrystalline silicon TFTs arrayed with a pitch of 330 µm is formed on a panel substrate having a display area of 50 mm×50 mm.

Figure 7A:
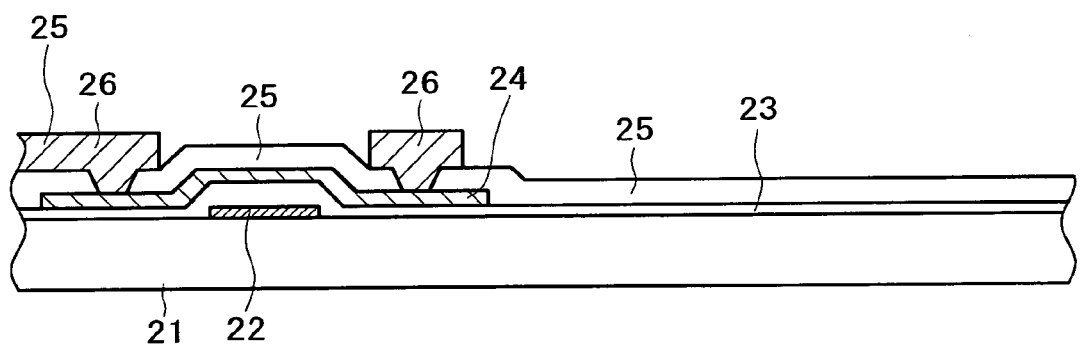

As shown in FIG. 7A, a gate electrode 22 made from a high-melting point metal such as chromium (Cr) or molybdenum (Mo) was formed on a panel substrate 21 made from glass. A gate insulating film 23 made from SiN (silicon nitride)/$SiO_2$ (silicon oxide), and an active layer 24 made from poly-silicon were sequentially stacked on the gate electrode 22. An interlayer insulating film 25 was formed so as to cover the gate insulating film 23 and the active layer 24, and then contact holes communicated to the active layer 24 were formed in the interlayer insulating film 25. A low-resistance metal layer 26 made from aluminum (Al) was stacked in such a manner as to bury the contact holes.

Figure 7B:
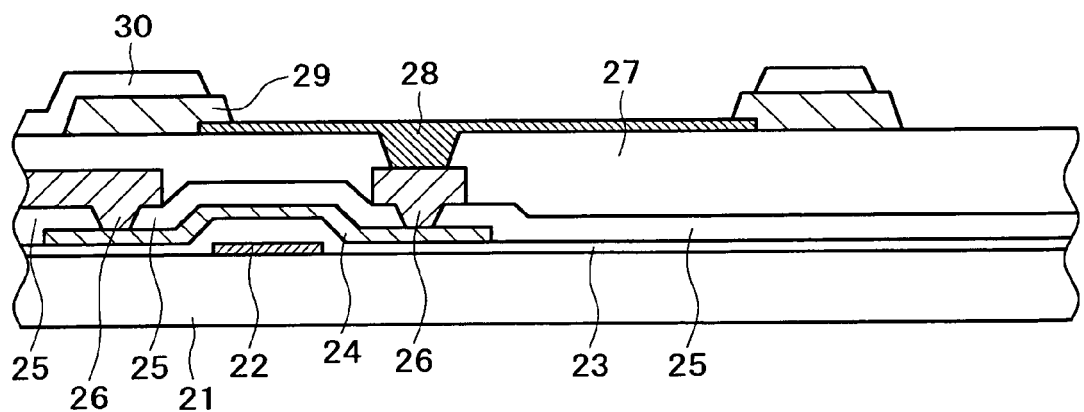

As shown in FIG. 7B, a planarization film 27 having a thickness of 2 µm and an anode electrode 28 made from Cr and having a thickness of 220 nm, an insulating film 29 made from $SiO_2$ for forming a light emission opening portion, and a low-resistance metal layer 30 having a thickness of 200 nm for forming a cathode extraction electrode were formed on the interlayer insulating film 25 and the low-resistance metal layer 26, followed by patterning.

Figure 7C:
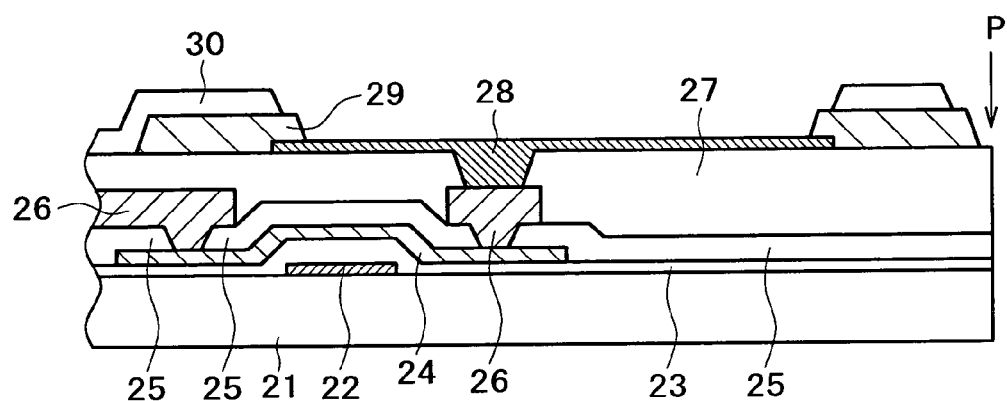

As shown in FIG. 7C, an end portion (cutting point) P, offset outwardly from the outermost pixel on the display area by 30 µm, of the panel substrate 21 was cut by a glass cutter. Two pieces of the panel substrates 21, each of which was cut at the cutting point P, were thus prepared.

Figure 7D:
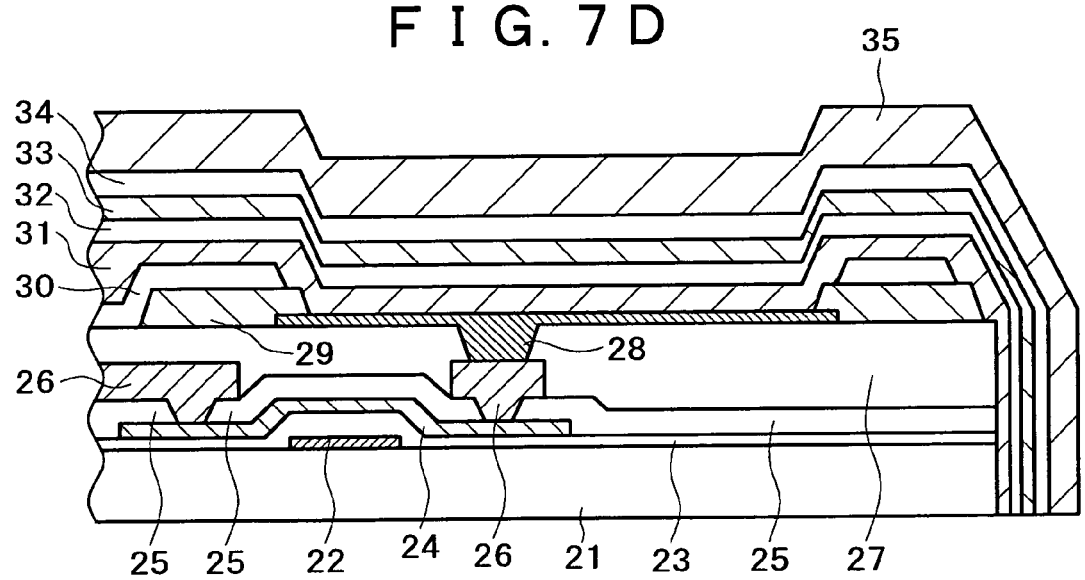

As shown in FIG. 7D, a 2-TNATA (4,4',4''-tris(2-naphth-ylphenylamino)triphenylamine). Layer (thickness: 50 nm) was formed as a hole-injection layer 31 on each panel substrate 21 at a deposition rate of 0.1 nm/sec in vacuum by a vacuum vapor-deposition process. An α-NPD (naphth-ylphenyldiamine) layer (thickness: 30 µm) was formed as a hole-transfer layer 32 on the hole-injection layer 31 at a deposition rate of 0.1 nm/sec in vacuum by a vacuum vapor-deposition process. An Alq3 (8-hydroxy quinorine aluminum) layer (thickness: 40 µm) was formed as a light-emitting layer 33 on the hole-transfer layer 32 by vapor-deposition. An MgAg (composition: 9:1) layer (thickness: 20 nm) was formed as a cathode electrode 34 on the light-emitting layer 33 in vacuum by a vacuum vapor-deposition process. In this case, a vapor-deposition mask was used, which was set so as to cover the entire light-emitting area while being not in contact with the anode electrode 28 but in contact with the Al extraction electrode. An SiNx film (thickness: 2 µm) was formed as an inorganic seal layer 35 on the cathode surface by a plasma CVD process. In this case, an area mask was used, which was set so as not to cover contact portions being in contact with the anode electrode and the cathode electrode.

Two panels 4 and 5 were thus obtained and joined to each other as follows. As shown in FIG. 7E, the two panels 4 and 5 were arranged such that the cut surfaces thereof were opposed to each other with a gap of 50 µm kept therebetween. In this state, a thermosetting resin as a seal material was applied on the area covered with the SiNx film, and a seal glass member having a size not to cover the electrode contact portions was stuck on the seal material. The two panels 4 and 5 were then heated at 60° C. for 4 hr, to be joined to each other. A panel structure was thus produced.

The panel structure was left in atmospheric air and was driven to cause light emission from the organic EL devices at an interval of a specific period of time, and an erosion degree of the organic EL devices due to permeation of moisture, air, and the like was observed with elapsed days using an erosion distance from the cut end of each panel to the light-emitting region as a parameter. As a result, it was confirmed that in Comparative Example, as shown in FIG. 8, erosion to the light-emitting portion begins after an elapse of 20 days since start of observation, and proceeds at an erosion rate of about 2 µm per one day.

EXAMPLE 1

In this example, an active matrix type display unit, which includes two panels joined to each other, wherein a seal material is applied to a joint portion between the panels, is prepared, and erosion deterioration of organic EL devices in this display unit is examined.

In this example, two panels were produced and joined to each other into one panel structure in the same manner as that described in Comparative Example.

Figure 9:
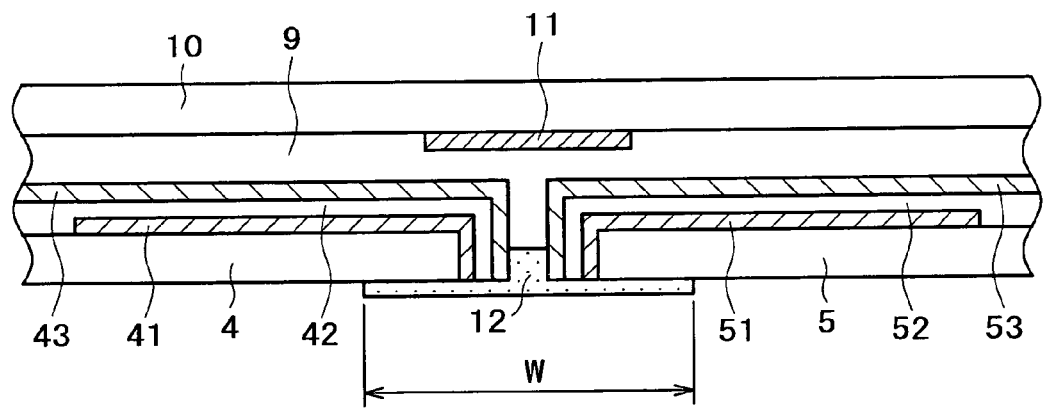
FIG. 9 is a view illustrating a panel structure according to Example 1.

Next, as shown in FIG. 9, from the back surface side of the panel structure composed of the panels 4 and 5, a seal material 12 made from a thermosetting resin was applied on a joint portion between the panels 4 and 5. To cover a portion separated from the cut end of each of the panels 4 and 5 by a distance of 5 mm with the seal material 12, an applying width W of the seal material 12 was set to about 10 mm. The panel structure was then heated at 60° C. for 4 hr.

The panel structure was left in atmospheric air and was driven to cause light emission from the organic EL devices at an interval of a specific period of time, and an erosion degree of the organic EL devices due to permeation of moisture, air, and the like was observed with elapsed days using an erosion distance from the cut end of each panel to the light-emitting region as a parameter. As a result, it was confirmed that in Example 1, as shown in FIG. 8, erosion to the light-emitting portion begins after an elapse of 60 days since start of observation, and proceeds at an erosion rate of about 0.5 µm per one day. This shows that the erosion degree to the organic EL devices in Example 1 becomes smaller than that in Comparative Example.

EXAMPLE 2

In this example, an active matrix type display unit, which includes two panels joined to each other, wherein a seal material is applied to a joint portion between the panels and a plate-like member made from glass and having a width of 10 mm is stuck on the seal material, is prepared, and erosion deterioration of organic EL devices in this display unit is examined.

In this example, two panels were produced and joined to each other into one panel structure in the same manner as that described in Comparative Example.

Figure 10:
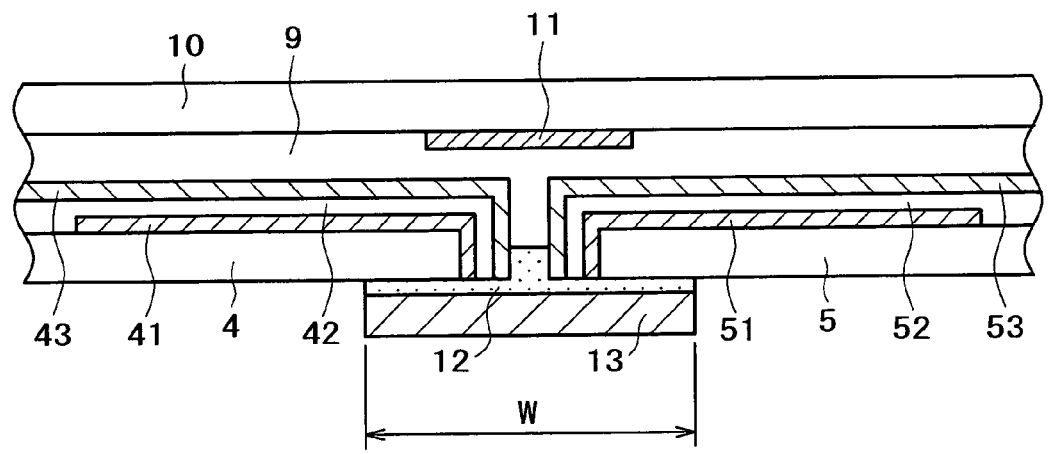
FIG. 10 is a view illustrating a panel structure according to Example 2.

As shown in FIG. 10, from the back surface side of the panel structure composed of the two panels 4 and 5, a seal material 12 made from a thermosetting resin was applied on a joint portion between the panels 4 and 5. To cover a portion separated from the cut end of each of the panels 4 and 5 by a distance of 5 mm with the seal material 12, an applying width W of the seal material 12 was set to about 10 mm. A plate-like member 13 made from glass and having a width of 10 mm (the same width as that of the seal material 12) was stuck on the seal material 12. The panel structure was then heated at 60° C. for 4 hr.

The panel structure was left in atmospheric air and was driven to cause light emission from the organic EL devices at an interval of a specific period of time, and an erosion degree of the organic EL devices due to permeation of moisture, air, and the like was observed with elapsed days using an erosion distance from the cut end of each panel to the light-emitting region as a parameter. As a result, it was confirmed that in Example 2, as shown in FIG. 8, erosion to the light-emitting portion begins after an elapse of 60 days since start of observation, and proceeds at an erosion rate of about 0.5 µm per one day.

EXAMPLE 3

In this example, an active matrix type display unit, which includes two panels joined to each other, wherein a seal material is applied to a joint portion between the panels and a plate-like member made from aluminum (which has been subjected to a blackening treatment) and having a width of 10 mm is stuck on the seal material, is prepared, and erosion deterioration of organic EL devices in this display unit is examined.

In this example, two panels were produced and joined to each other, to obtain one panel structure in the same manner as that described in Comparative Example.

Figure 11:
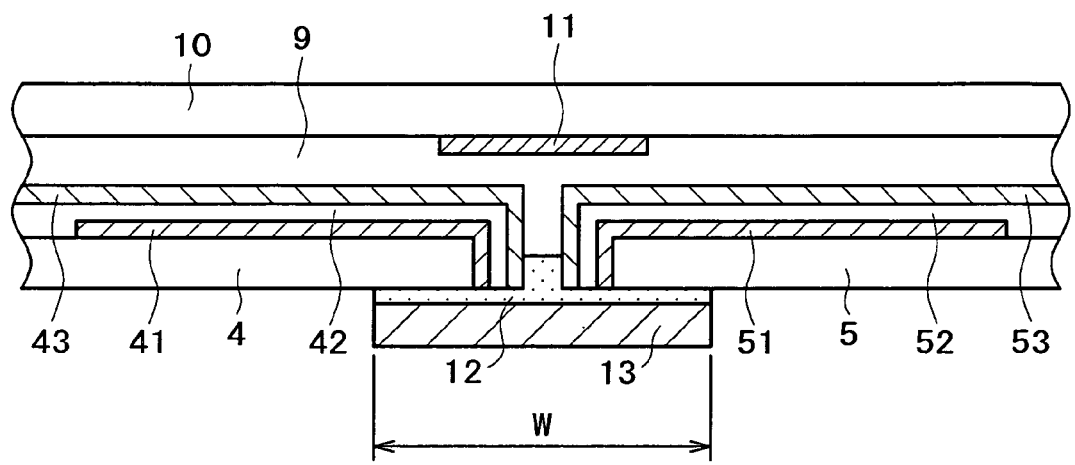
FIG. 11 is a view illustrating a panel structure according to Example 3.

As shown in FIG. 11, from the back surface side of the panel structure composed of the two panels 4 and 5, a seal material 12 made from a thermosetting resin was applied on a joint portion between the panels 4 and 5. To cover a portion separated from the cut end of each of the panels 4 and 5 by a distance of 5 mm with the seal material 12, an applying width W of the seal material 12 was set to about 10 mm. A plate-like member 13 made from aluminum (which has been subjected to a blackening treatment) having a width of 10 mm (the same width as that of the seal material 12) was stuck on the seal material 12. The panel structure was then heated at 60° C. for 4 hr.

The panel structure was left in atmospheric air and was driven to cause light emission from the organic EL devices at an interval of a specific period of time, and an erosion degree of the organic EL devices due to permeation of moisture, air, and the like was observed with elapsed days using an erosion distance from the cut end of each panel to the light-emitting region as a parameter. As a result, it was confirmed that in Example 3, as shown in FIG. 8, erosion to the light-emitting portion begins after an elapse of 60 days since start of observation, and proceeds at an erosion rate of about 0.5 µm per one day, and the mechanical strength of the joint portion is increased.

EXAMPLE 4

In this example, an active matrix type display unit, which includes two panels joined to each other, wherein a seal material is applied to a joint portion between the panels and a plate-like member made from aluminum (which has been subjected to a blackening treatment) and having a width of 20 mm is stuck on the seal material, is prepared, and erosion deterioration of organic EL devices in this display unit is examined.

In this example, two panels were produced and joined to each other, to obtain one panel structure in the same manner as that described in Comparative Example.

Figure 12:
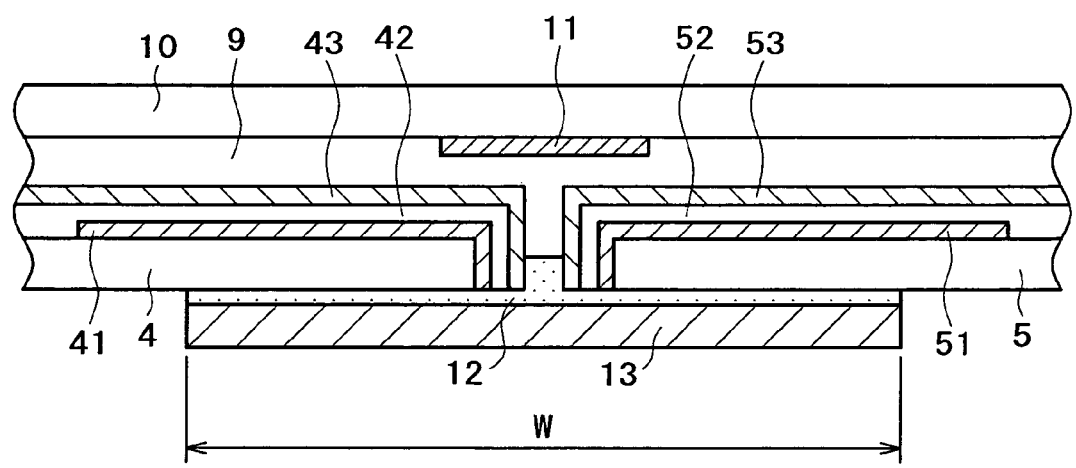
FIG. 12 is a view illustrating a panel structure according to each of Examples 4 and 5.

As shown in FIG. 12, from the back surface side of the panel structure composed of the two panels 4 and 5, a seal material 12 made from a thermosetting resin was applied on a joint portion between the panels 4 and 5. To cover a portion separated from the cut end of each of the panels 4 and 5 by a distance of 10 mm with the seal material 12, an applying width W of the seal material 12 was set to about 20 mm. A plate-like member 13 made from aluminum (which has been subjected to a blackening treatment) having a width of 20 mm (the same width as that of the seal material 12) was stuck on the seal material 12. The panel structure was then heated at 60° C. for 4 hr.

The panel structure was left in atmospheric air and was driven to cause light emission from the organic EL devices at an interval of a specific period of time, and an erosion degree of the organic EL devices due to permeation of moisture, air, and the like was observed with elapsed days using an erosion distance from the cut end of each panel to the light-emitting region as a parameter. As a result, it was confirmed that in Example 4, erosion to the light-emitting portion does not appear even after an elapse of 100 days since start of observation.

EXAMPLE 5

In this example, an active matrix type display unit, which includes four panels joined to each other, wherein a seal material is applied to a joint portion between adjacent two of the panels and a plate-like member made from aluminum (which has been subjected to a blackening treatment) having a width of 20 mm is stuck on the seal material, is prepared, and erosion deterioration of organic EL devices in this display unit is examined.

In this example, four panels 2, 3, 4, and 5 shown in FIG. 1 were produced and joined to each other into one panel structure in the same manner as that described in Comparative Example.

Like the manner described in Example 4 (see FIG. 12), from the back surface side of the panel structure composed of the four panels 2, 3, 4 and 5, a seal material 12 made from a thermosetting resin was applied on a joint portion between adjacent two of the panels 2, 3, 4 and 5. To cover a portion separated from the cut end of each of the panels 2, 3, 4 and 5 by a distance of 10 mm with the seal material 12, an applying width W of the seal material 12 was set to about 20 mm. A cruciform plate-like member 13 (see FIG. 5), made from aluminum (which has been subjected to a blackening treatment) having a width of 20 mm (the same width as that of the seal material 12), was stuck on the seal material 12. The panel structure was then heated at 60° C. for 4 hr.

The panel structure was left in atmospheric air and was driven to cause light emission from the organic EL devices at an interval of a specific period of time, and an erosion degree of the organic EL devices due to permeation of moisture, air, and the like was observed with elapsed days using an erosion distance from the cut end of each panel to the light-emitting region as a parameter. As a result, it was confirmed that in Example 5, erosion to the light-emitting portion does not appear even after an elapse of 100 days since start of observation.

As described above, the display unit produced according to the present invention is configured such that a plurality of panels are joined to each other into one display screen and a seal material is applied to the joint portion between adjacent two of the plurality of panels. As a result, the display unit makes it possible to effectively suppress erosion of organic EL devices and hence to prevent deterioration of characteristics of the display unit.

While the preferred embodiment and examples have been described using specific terms, such description is for illustrative purposes only, and it is to be understood that changes and variations may be made without departing from the spirit or scope of the following claims.

What is claimed is:

1. A display unit comprising:

a plurality of drive panels arranged and combined to a seal panel with a sealing layer therebetween to form one display screen, each of said drive panels being provided with organic electroluminescence devices on a first side facing said seal panel; and a seal material applied from the opposite side of said drive panels so as to fill in a gap between adjacent two of said plurality of drive panels such that the seal material extends in a horizontal direction beyond the width of the gap so as to cover a portion of the surface of each of the adjacent drive panels; and wherein light is emitted to the outside from the side of the seal panel, further comprising a plate-like member stuck at least over said gap portion via said seal material and wherein the plate-like member is formed in a matrix shape comprising at least two perpendicular intersecting strips, and wherein the width of each strip is substantially the same as the width of the applied seal material.

* * * * *